US009318204B1

(12) United States Patent
Chen et al.

(10) Patent No.: US 9,318,204 B1
(45) Date of Patent: Apr. 19, 2016

(54) NON-VOLATILE MEMORY AND METHOD WITH ADJUSTED TIMING FOR INDIVIDUAL PROGRAMMING PULSES

(71) Applicant: SanDisk Technologies, Inc., Plano, TX (US)

(72) Inventors: Han Chen, Nanjing (CN); Man Lung Mui, Fremont, CA (US); Kou Tei, San Jose, CA (US)

(73) Assignee: SanDisk Technologies, Inc., Plano, TX (US)

(*) Notice: Subject to any disclaimer, the term of this patent is extended or adjusted under 35 U.S.C. 154(b) by 0 days.

(21) Appl. No.: 14/508,352

(22) Filed: Oct. 7, 2014

(51) Int. Cl.
G11C 16/04 (2006.01)
G11C 16/10 (2006.01)
G11C 16/32 (2006.01)

(52) U.S. Cl.
CPC .............. *G11C 16/10* (2013.01); *G11C 16/32* (2013.01)

(58) Field of Classification Search
CPC ... G11C 16/0483; G11C 16/10; H01L 27/115
USPC ............................ 365/185.17, 185.14, 185.28
See application file for complete search history.

(56) References Cited

U.S. PATENT DOCUMENTS

| 5,070,032 | A | 12/1991 | Yuan et al. |
|---|---|---|---|
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 8,933,516 | B1 | 1/2015 | Wu et al. |
| 2005/0237829 | A1 | 10/2005 | Nakamura |
| 2005/0267699 | A1 | 12/2005 | Claseman |
| 2006/0158935 | A1* | 7/2006 | Chan ............ G11C 7/062 365/185.17 |
| 2006/0268609 | A1 | 11/2006 | Kim |
| 2007/0252201 | A1 | 11/2007 | Kito et al. |
| 2008/0209150 | A1 | 8/2008 | Byeon |
| 2010/0174845 | A1 | 7/2010 | Gorobets et al. |
| 2010/0322000 | A1 | 12/2010 | Shim et al. |
| 2012/0220088 | A1 | 8/2012 | Alsmeier |
| 2013/0107628 | A1 | 5/2013 | Dong et al. |
| 2014/0003157 | A1 | 1/2014 | Mui et al. |
| 2014/0047163 | A1 | 2/2014 | Kawk |
| 2014/0169095 | A1 | 6/2014 | Avila et al. |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Non-Final Office Action issued in U.S. Appl. No. 14/328,018, mailed on Jun. 19, 2015, 13 pages.
U.S. Appl. No. 13/927,659, filed Jun. 26, 2013, 41 pages.
U.S. Appl. No. 13/925,662, filed Jun. 24, 2013, 36 pages.
Non-Final Office Action issued in U.S. Appl. No. 14/486,152 mailed Sep. 21, 2015, 21 pages.

* cited by examiner

*Primary Examiner* — Jason Lappas
(74) *Attorney, Agent, or Firm* — Sterne, Kessler, Goldstein & Fox P.L.L.C.

(57) ABSTRACT

A non-volatile memory and method have programming circuitry that outputs a series of programming pulses of increasing voltage level to program in parallel a group of memory cells associated with a selected word line. Individual timing of the programming pulses such as rise and fall times of the pulse is optimally and dynamically adjusted according to the relative numbers of program-enabled and program-inhibited memory cells in the group associated with that pulse.

20 Claims, 14 Drawing Sheets

Programming into four states represented by a 2-bit code

Example Progam/Verify voltages on a Word Line

Setting the Bit Line to a program-enabled voltage

Setting the Bit Line to a program-inhibited voltage

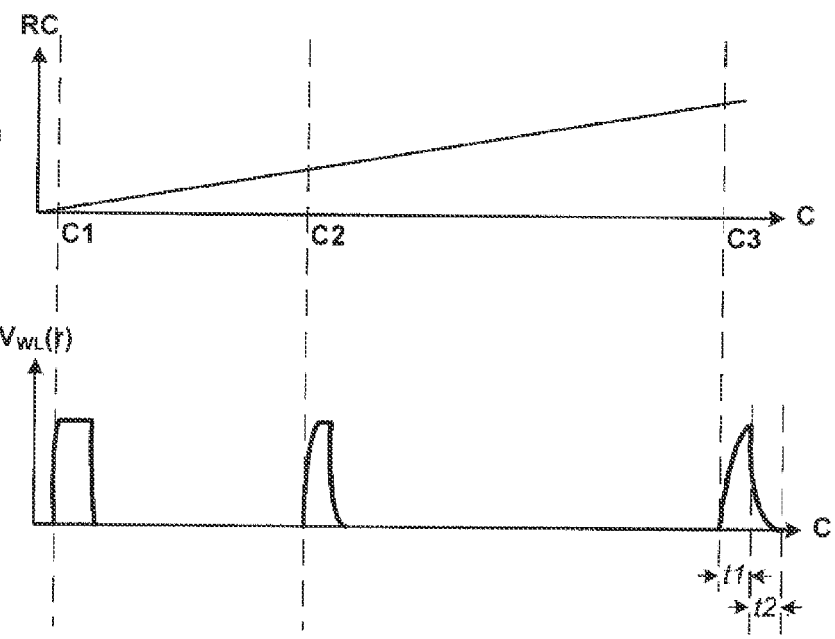
FIG. 10(A)
FIG. 10(B)
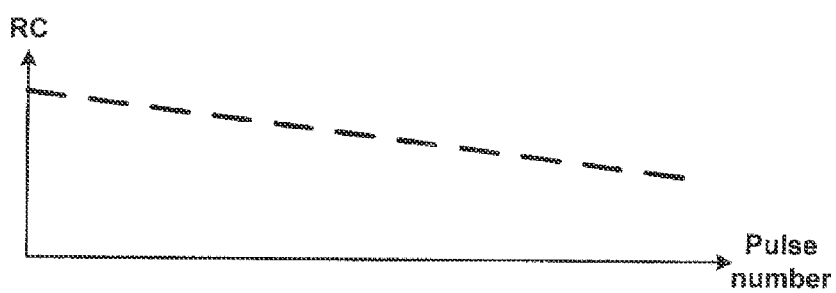
FIG. 11(A)
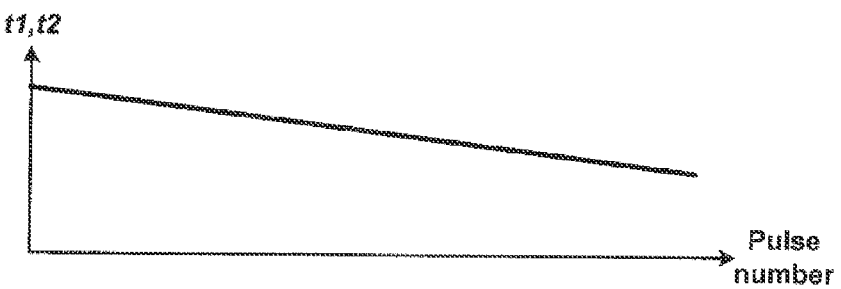
FIG. 11(B)

NON-VOLATILE MEMORY AND METHOD WITH ADJUSTED TIMING FOR INDIVIDUAL PROGRAMMING PULSES

BACKGROUND

This application relates to two- or three-dimensional memory systems such as semiconductor flash memory which record data using charge stored in charge storage elements of re-programmable nonvolatile memory cells, and more particularly to programming circuitry and a method of dynamically adjusting timing for individual programming pulses Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

Programming a group of non-volatile memory cells on a word line typically involves applying a series of programming pulses of increasing voltage level to the word line. Owing to a finite RC constant of the word line, it takes time to charge and discharge the word line to predetermined voltage levels. The timing of the pulses must allow for delays due to the RC constant. Conventionally, a worst-case timing is applied to all pulses, resulting in less than optimum programming performance and increased program disturb.

Each memory cell has a channel from which charges are pulled to a charge storage element by a programming voltage on the word line. In the case of a NAND memory, the channel is across an entire NAND string. An effective word line capacitance is dependent on the sum of word line to channel capacitance contributed from each memory cell of the group being programmed in parallel. However, when a memory cell has been programmed to its target state, it is put in a program-inhibited state to prevent further programming by additional pulses. This is accomplished by disconnecting the memory cell from the bit line which also results in its contribution to the effective word line capacitance being discounted.

The present device and method allow for individual timing of the programming pulses. The rise and fall times of the pulse is optimally and dynamically adjusted according to the relative numbers of program-enabled and program-inhibited memory cells in the group associated with that pulse.

A non-volatile memory has programming circuitry that outputs a series of programming pulses of increasing voltage level to program in parallel a group of memory cells associated with a selected word line. Individual timing of the programming pulses such as rise and fall times of the pulse is optimally and dynamically adjusted according to the relative numbers of program-enabled and program-inhibited memory cells in the group associated with that pulse.

The individual timing of a pulse is dependent on the RC constant of the word line. For example, the RC constant has a dependency given by $(n_2/N)RCmin+(n_1/N)RCmax$, where RCmin and RCmax are respectively a minimum and maximum value of the RC constant, N is the total number memory cells in the group, $n_1$ and $n_2$ are respectively the numbers of program-enabled and program-inhibited memory cells in the group.

In another embodiment, the relative numbers of program-enabled and program-inhibited memory cells in the group associated with that pulse could be estimated as a function of the pulse number. This is possible if the data to be programmed is first scrambled (as is usually the practice for other considerations) to avoid unusual data pattern skewing the functional dependency.

A method of programming in parallel a group of memory cells of a non-volatile memory includes providing a plurality of word lines and bit lines for accessing said array of memory cells, applying a programming voltage through a word line with a series of pulses with increasing voltage level, determining numbers of program-enabled and program-inhibited memory cells in the group that vary dynamically with each pulse, and adjusting an individual timing of a pulse, responsive to relative numbers of program-enabled and program-inhibited memory cells in the group associated with the pulse.

When the timing of the pulses is individually optimized, the overall programming time is reduced. For example, the time delays of pulses later in the series are set to less those earlier in the series, as more and more program-enabled memory cells become program-inhibited memory cells during the course of the programming. The reduced programming time also helps to reduce program disturb. This is owing to minimizing the time for the program-inhibited memory cells to hold the boosted voltage during programming, which has a tendency to leaking away, thereby reducing their program-inhibition efficacy and causing unwanted programming.

The same principle of individually optimized timing applies to charging up unselected word lines. For example in a memory with NAND architecture, the unselected word lines of a NAND string are precharged to a predetermined voltage (Vpass) to turn on the unselected memory cells in the NAND string. The timing for precharge can also be optimized according to the relative numbers of program-enabled and program-inhibited memory cells in the group associated with the pulse at the time.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 10(A) illustrates the product of resistance and capacitance for a given segment of the word line being proportional to the capacitance.

FIG. 10(B) illustrates the response of a programming pulse for the three values of Cs shown in FIG. 10(A).

FIG. 11(A) illustrates schematically the variation of the effective RC constant of a word line with pulse number during programming.

FIG. 11(B) illustrates schematically the variation of the timing delay of a word line with pulse number during programming.

DETAILED DESCRIPTION

Memory System

Figure 1:
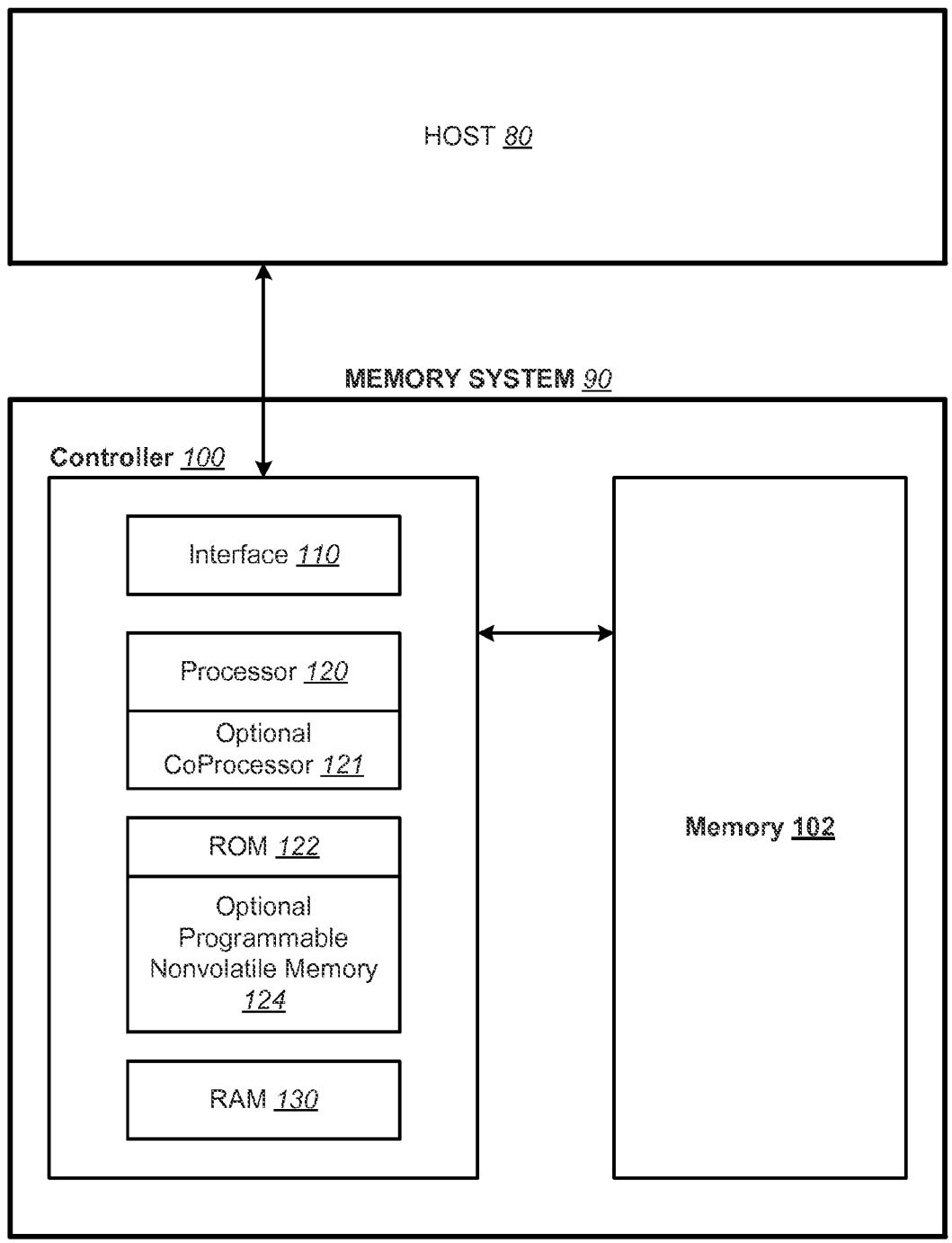
FIG. 1 illustrates schematically the main hardware components of a memory system suitable for implementing the present subject matter.

FIG. 1 illustrates schematically the main hardware components of a memory system suitable for implementing the present subject matter. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
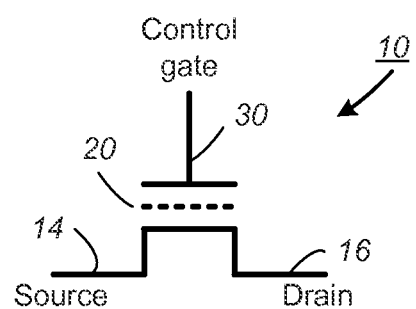
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage element 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
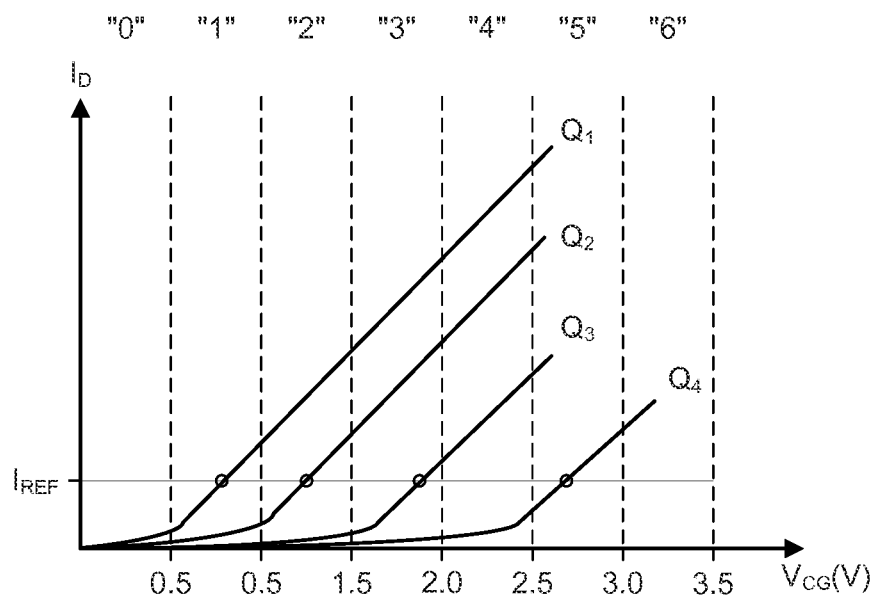
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
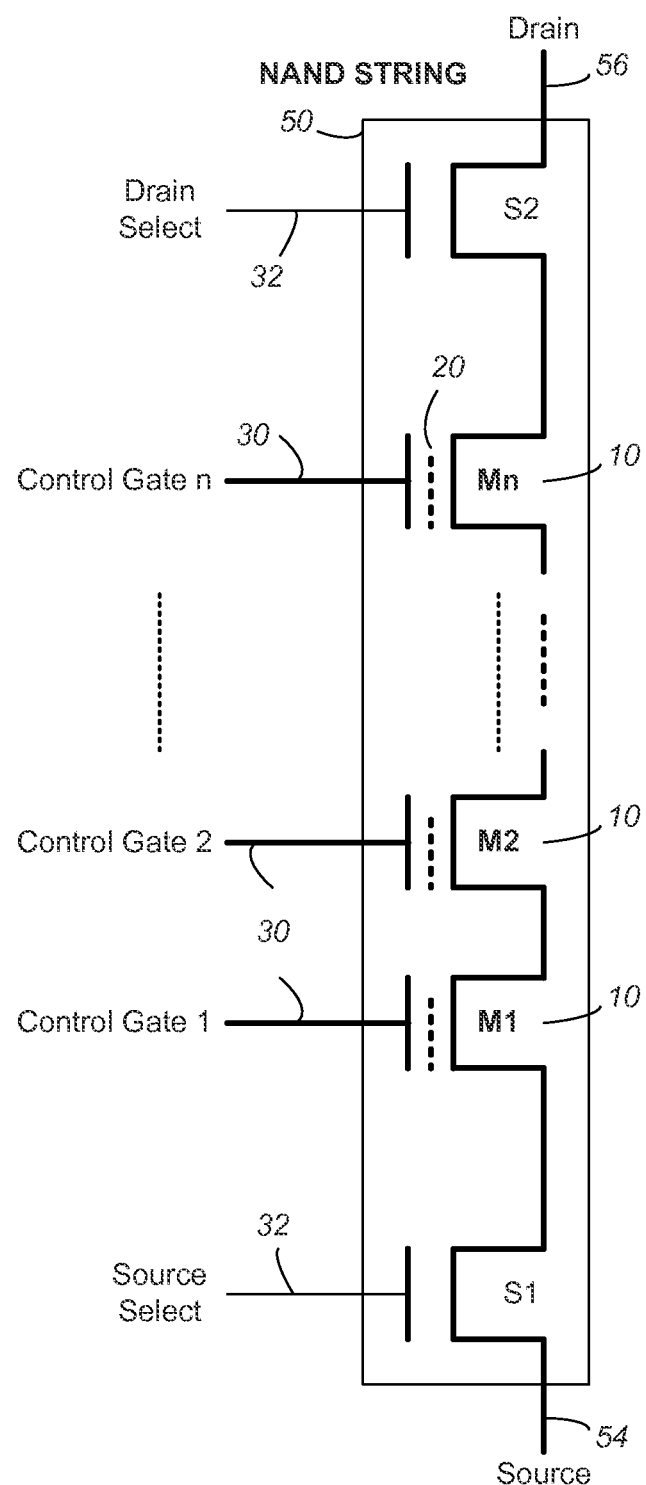
FIG. 4 illustrates schematically a daisy chain of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
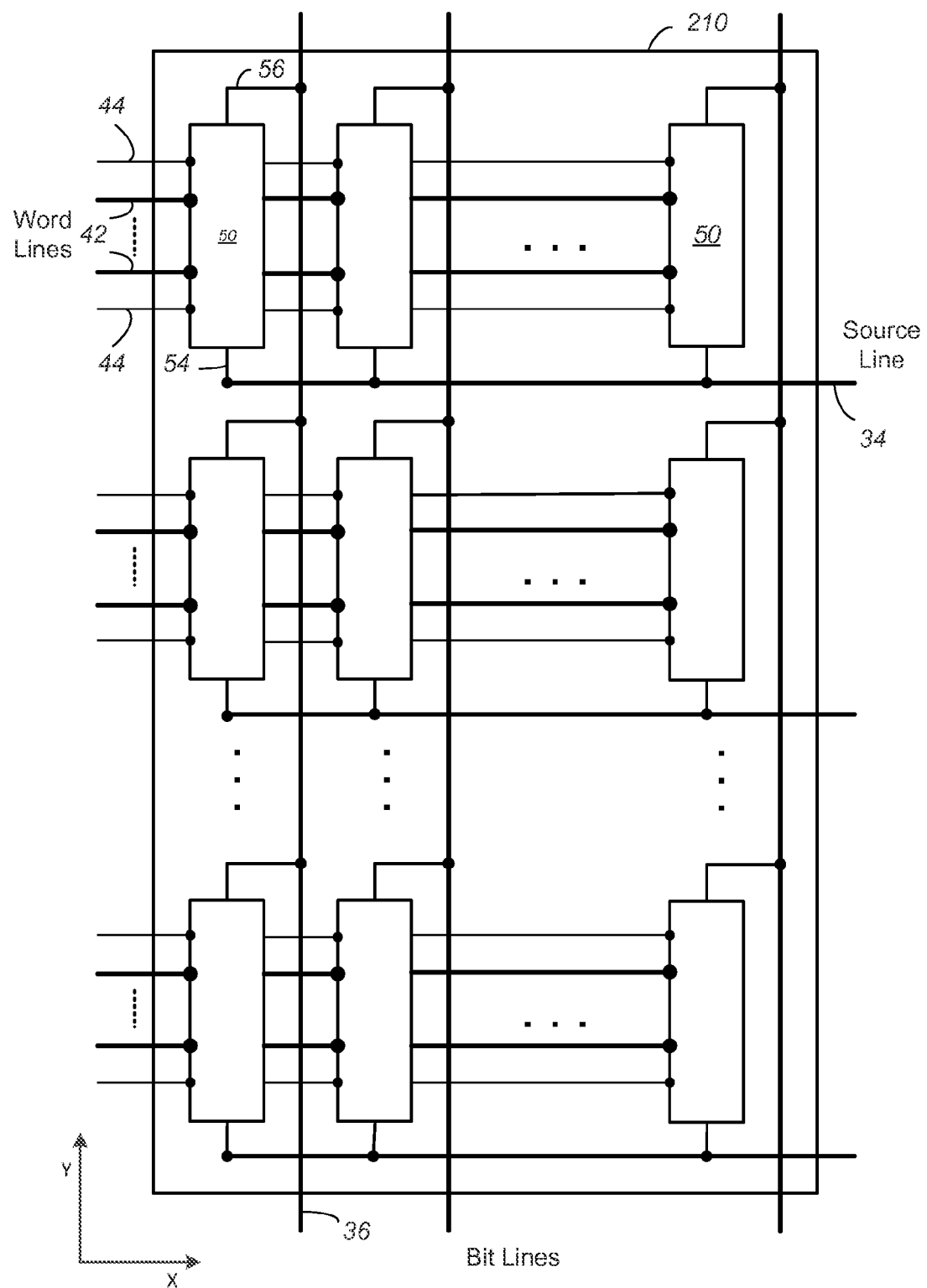
FIG. 5 illustrates an example of a NAND array of memory cells, constituted from NAND strings such as that shown in FIG. 4A.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
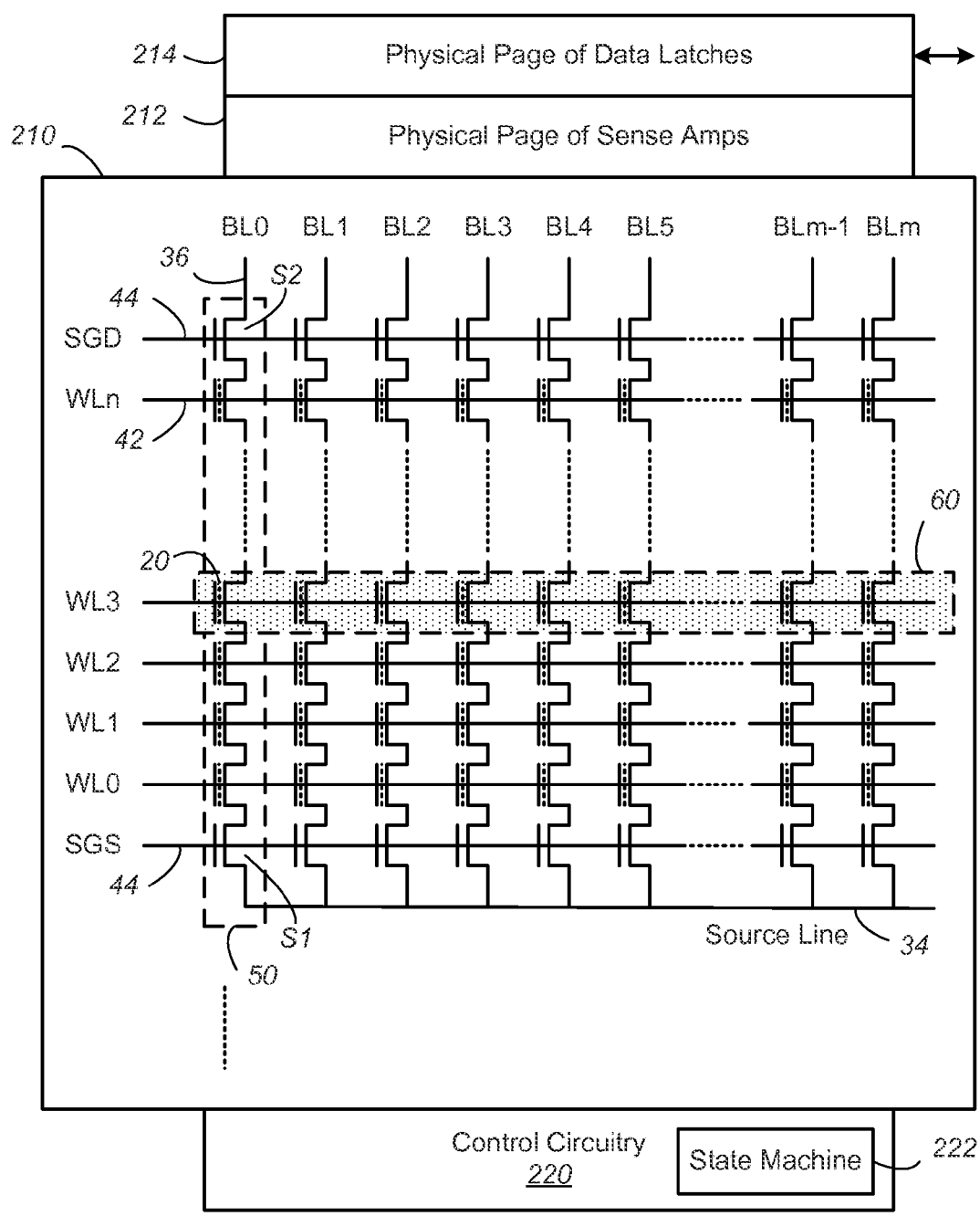
FIG. 6 illustrates a 2D NAND memory in the x-y plane.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines. A chip-level control circuitry 220 has a state machine 222 that controls the memory operations.

Physical Organization of the Memory

One difference between flash memory and other of types of memory is that a cell is programmed from the erased state. That is, the floating gate is first emptied of charge. Programming then adds a desired amount of charge back to the floating gate. It does not support removing a portion of the charge from the floating gate to go from a more programmed state to a lesser one. This means that updated data cannot overwrite existing data and is written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
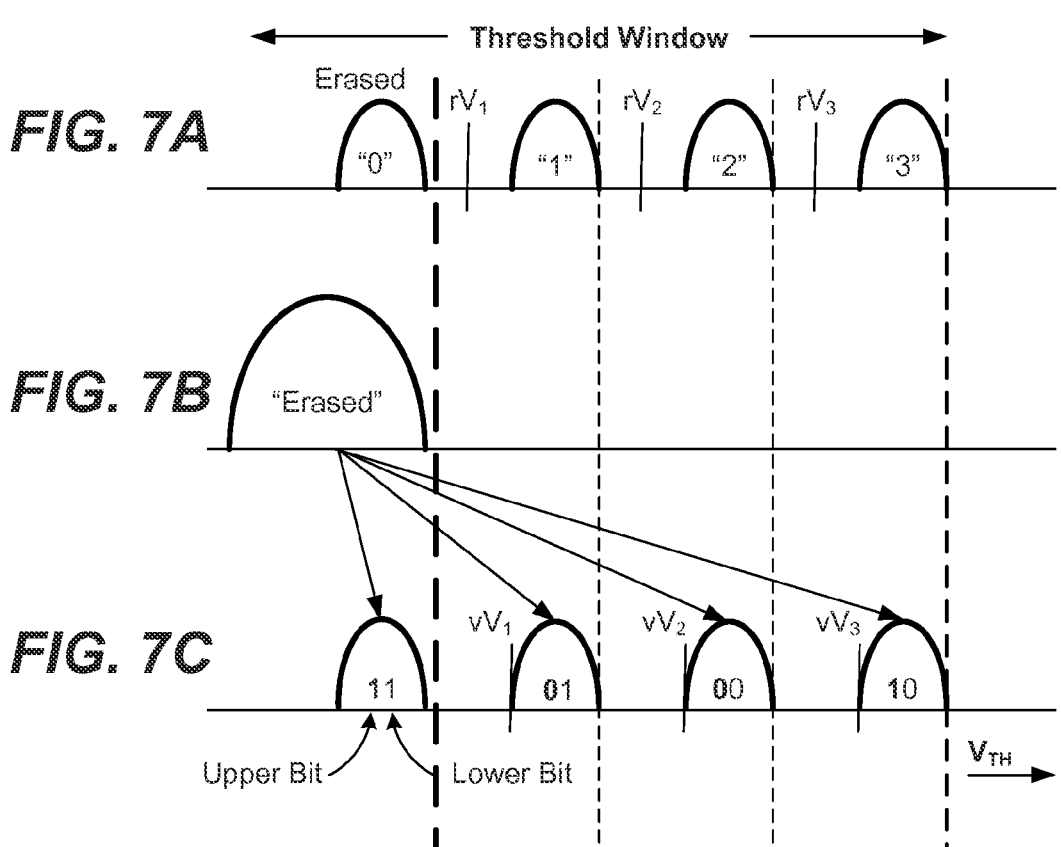
FIG. 7A illustrates the population of memory cells programmable into four distinct distributions of threshold voltages respectively representing memory states "E", "A", "B" and "C".
FIG. 7B illustrates the initial distribution of "erased" threshold voltages for an erased memory.
FIG. 7C illustrates an example of the memory after many of the memory cells have been programmed.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Programming a Group of Memory Cells in Parallel

As explained earlier, to improve performance, a group (i.e., page 60, see FIG. 6) of memory cells are programmed in parallel. The group of memory cells has their control gates connected to a common word line 42 and has the drain terminals 36 connected to a sense amplifier 212 via a respective bit line 36. Prior to programming the group of memory cells is first erased as part of an erase block.

Figure 8:
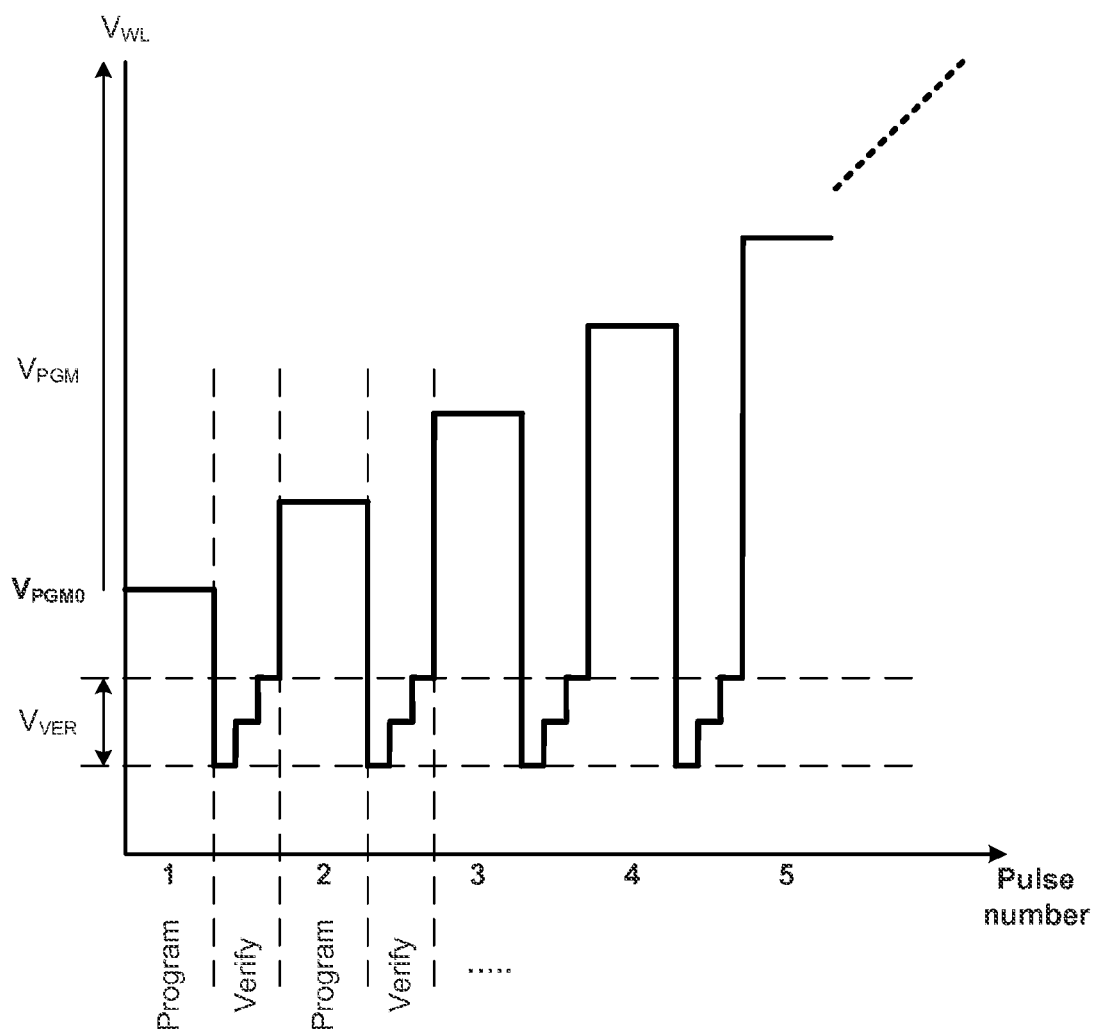
FIG. 8 illustrates a series of programming voltage pulses in the form of a staircase waveform being applied to a selected word line.

FIG. 8 illustrates a series of programming voltage pulses in the form of a staircase waveform being applied to a selected word line. When a cell is being programmed to a given state, it is subject to successive programming voltage pulses, each time attempting to add incremental charges to the charge storage element. In between programming pulses, the cell is read back or verified to determine its source-drain current relative to a breakpoint level. Programming stops for a cell when it has been verified to reach the desired state. The programming pulses typically have increasing amplitude in order to counteract the accumulating electrons programmed into the charge storage element of the memory cell. Programming circuits generally apply, in a programming loop, a series of programming pulses to a selected word line. In this way, a page of memory cells whose control gates are connected to the word line can be programmed together. Whenever a memory cell of the page has been programmed to its target state, it is program-inhibited while the other memory cells continue to be subject to programming until all memory cells of the page have been program-verified. Thus, prior to programming a page, a number of memory cells in the page are slated to be programmed and they are enabled for programming. As the pulse number increases, more and more of the memory cells have been programmed to their target state and are then put into a program-inhibited state until all memory cells have been programmed.

To prevent memory cells in the group that have been verified from being programmed further while the programming loop is still on-going, these cells are program-inhibited while the remaining memory cells that have yet to be verified are program-enabled.

Figure 9A:
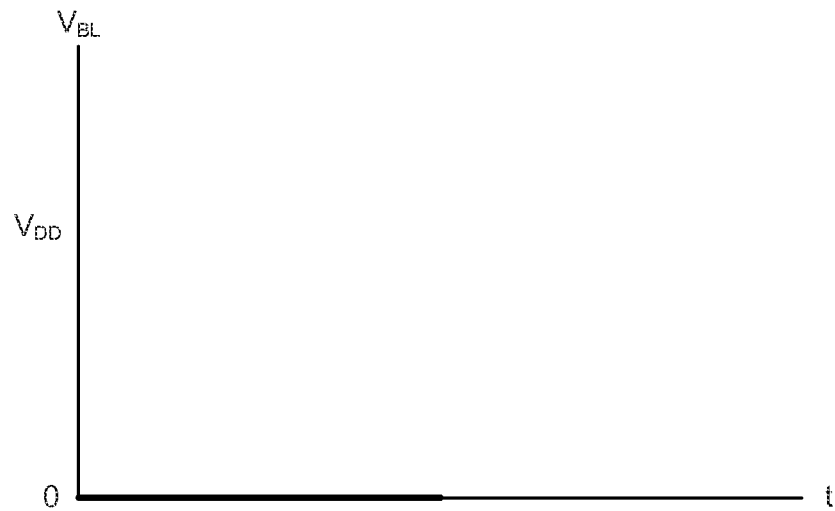
FIG. 9A illustrates putting the memory cell in a program-enabled state by setting the respective bit line voltage to zero.

FIG. 9A illustrates putting the memory cell in a program-enabled state by setting the respective bit line voltage to zero. Referring also to FIG. 6, in operation the page of NAND strings associated with bit lines BL0 to BLm has the gates of drain-side transistor switches S2 set to SGD=Vdd. When a bit line is biased to VBL=0V, the drain-side transistor switch for that bit line is turned on, which also results in the channel of the NAND string to be at 0V. This is a program-enabled state because, when a programming voltage is applied to a selected word line, the maximum programming voltage is developed between the word line and the channel. This creates a favorable condition for charges to tunnel from the channel to the charge storage element 20 between the channel and the word line.

Figure 9B:
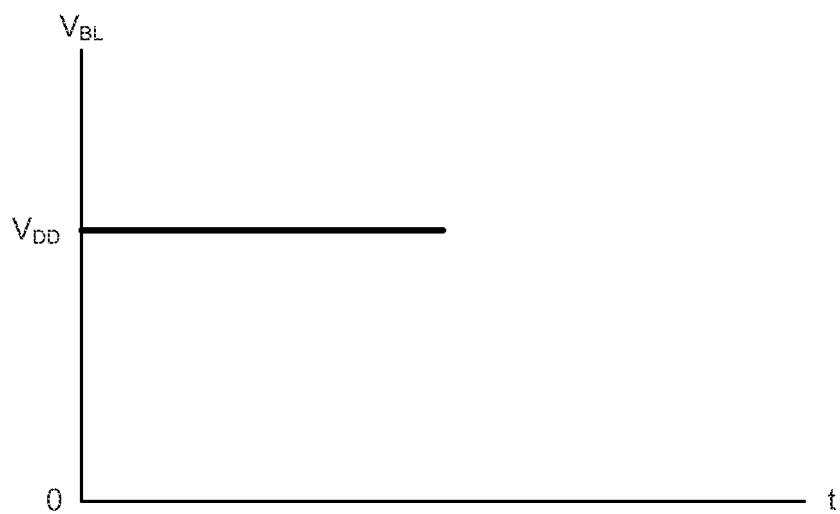
FIG. 9B illustrates putting the memory cell in a program-inhibited state by setting the respective bit line voltage to a voltage that disconnect the memory cell from the bit line.

FIG. 9B illustrates putting the memory cell in a program-inhibited state by setting the respective bit line voltage to a voltage that disconnect the memory cell from the bit line. Referring also to FIG. 6, in operation the page of NAND strings associated with bit lines BL0 to BLm has the gates of drain-side transistor switches S2 set to SGD=Vdd, which is a standard CMOS supply voltage. When a bit line is biased to VBL=Vdd, the drain-side transistor switch for that bit line is turned off, which cuts off the NAND string from the associated bit line and results in the channel of the NAND string to be floated. This is a program-inhibited state because, when a programming voltage is applied to a selected word line, the floated channel acquires a boosted voltage due to capacitive coupling with the programming voltage at the word line. Therefore the voltage between the channel and the word line is reduced, creating an unfavorable condition for charges to tunnel from the channel to the charge storage element 20 between the channel and the word line.

Timing of Programming Pulses

The programming voltage pulses shown in FIG. 8 are schematic in that the ramp up and ramp down of each square pulse are instantaneous. In practice, the word line has a finite capacitance and resistance. Bringing the word line to a specified voltage amounts to charging a capacitor, which will take finite time. Similarly, it will take time to discharge the specified voltage to zero. It will be described below that the time of charging and discharging is determined by an RC constant of the word line, where R and C are respectively the resistance and capacitance of the word line.

FIG. 10(A) illustrates the product of resistance and capacitance (RC constant) for a given segment of the word line being proportional to the capacitance. In general, the resistance of a segment of word line is proportional to the length of the segment. On the other hand, the capacitance of a segment is substantially independent of its length. Three increasing values of the capacitance, C1, C2 and C3 are distinguished for comparison.

FIG. 10(B) illustrates the response of a programming pulse for the three values of Cs shown in FIG. 10(A). When an individual programming pulse (see FIG. 6) is supplied to an assess node 46 to the word line (see FIG. 12), it essentially encounters an RC circuit. In general, assuming the variation of R across the word line is insignificant; the value of RC is constant. The word line voltage $V_{WL}$ is a response to the input programming pulse. The response is a charging up of the word line with time constant given by RC. The charged up voltage as a function of time t is $V_{WL}(t)=V_{WL}[1-\text{EXP}(-t/RC)]$. The discharged voltage at time t is $V_{WL}(t)=V_{WL}\text{EXP}(-$ t/RC). In other word, the product RC is a time constant that determines the rate of charging or discharging of the word line. After one unit of time constant, the word line will be charged to 63.2 percent. After two units of time constant, the word line will be charged to 86.5 percent, etc. Thus, the greater the RC, the slower will the charging and discharging be. For a rectangular programming pulse, the word line will be charging with the rising edge of the pulse and will be discharging with the falling edge of the pulse.

The effect of the RC variation is that for a word line with larger C, the RC delay is larger and therefore the efficacy of the programming pulse is diminished. Thus, the timing of each programming pulse must allow for the ramp up time t1 and the ramp down time t2.

Conventionally, pulses at any pulse number have the same timing, allowing for the worst-case (longest delay). This has two disadvantages. First, the read performance is reduced. Second, there are more program disturb. This is owing to minimizing the time for the program-inhibited memory cells has to hold the boosted voltage during programming, which has a tendency to leaking away, thereby reducing their program-inhibition efficacy and causing unwanted programming.

Variation of the Word Line Capacitance During Programming

In general the capacitance of a word line seen by a word line driver 232 (see FIG. 12) is the sum of the capacitance contributed by the word line plus all the NAND channels of the page of NAND strings. For example, when a NAND channel is connected to a bit line that has been set to 0V (as in a program-enabled mode), the NAND channel may be regarded as a ground plate of a capacitor and the word line as the other plate of the capacitor. On the other hand, in the program-inhibited mode, the NAND channel is disconnected from the bit line and is floating, so there is no such capacitor. Thus, the effective total capacitance of the word line is the sum of the capacitance contributed by the word line plus all the NAND channels of NAND strings that are programmed enabled.

Programming with Adaptive Timing Dependent on the Relative Proportions of Program-Enabled and Program-Inhibited Memory Cells in a Page FIG. 11(A) illustrates schematically the variation of the effective RC constant of a word line with pulse number during programming. As described earlier, when programming a page in parallel, the page initially has a number of memory cells not needing to be programmed and they are put in a program-inhibited mode. At the same time the remaining memory cells of the page are slated to be programmed and they are put in a program-enabled mode. As the programming proceeds with increasing pulse number, the remaining program-enabled memory cells become programmed and change to program-inhibited memory cells. At the end of the programming loop, essentially all memory cells of the page will be program-inhibited memory cells. Thus, the effective total capacitance of the word line decreases with every conversion of a programmed-enable memory cell to a programmed inhibited memory cell. It has been estimated that the difference of the effective total capacitance of the word line could change by 50% during the course of the programming loop. The variation of the capacitance C during programming is especially significant with NAND memory architecture where there are many memory cells daisy-chained on each NAND string.

FIG. 11(B) illustrates schematically the variation of the timing delay of a word line with pulse number during programming. Since the timing, such as t1 and t2 are dependent on the RC constant, the graph of FIG. 11(B) essentially tracks that of FIG. 11(A).

Programming a group of non-volatile memory cells on a word line typically involves applying a series of programming pulses of increasing voltage level to the word line. Owing to a finite RC constant of the word line, it takes time to charge and discharge the word line to predetermined voltage levels. The timing of the pulses must allow for delays due to the RC constant. Conventionally, a worst-case timing is applied to all pulses, resulting in less than optimum programming performance and increased program disturb.

Each memory cell has a channel from which charges are pulled to a charge storage element by a programming voltage on the word line. In the case of a NAND memory, the channel is across an entire NAND string. An effective word line capacitance is dependent on the sum of word line to channel capacitance contributed from each memory cell of the group being programmed in parallel. However, when a memory cell has been programmed to its target state, it is put in a program-inhibited state to prevent further programming by additional pulses. This is accomplished by disconnecting the memory cell from the bit line which also results in its contribution to the effective word line capacitance being discounted.

The present device and method allow for individual timing of the programming pulses. The rise and fall times of the pulse is optimally and dynamically adjusted according to the relative numbers of program-enabled and program-inhibited memory cells in the group associated with that pulse.

In another embodiment, the relative numbers of program-enabled and program-inhibited memory cells in the group associated with that pulse could be estimated as a function of the pulse number, as is illustrated in FIG. 11(A) and FIG. 11(B). This is possible if the data to be programmed is first scrambled (as is usually the practice for other considerations) to avoid unusual data pattern skewing the functional dependency.

Figure 12:
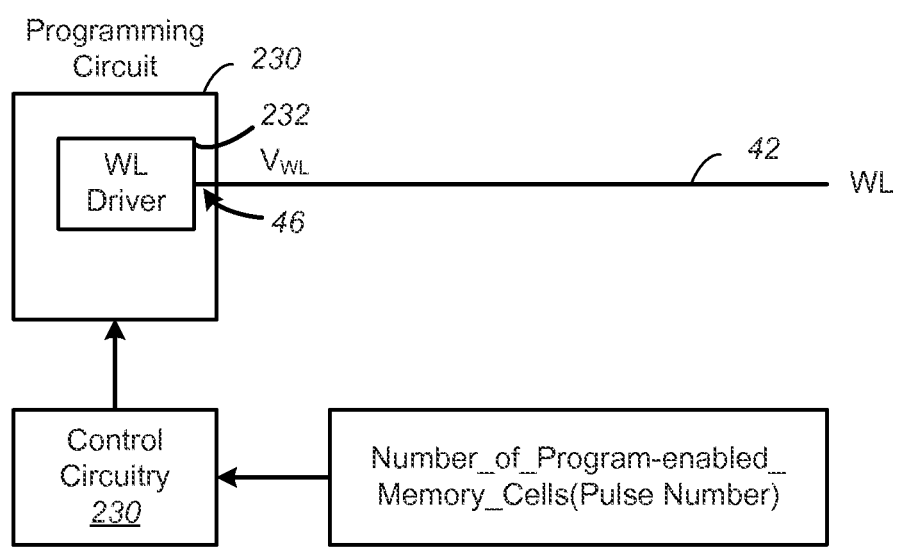
FIG. 12 illustrates a programming circuit that optimizes the timing of individual programming pulses according to the relative number of program-enabled and program-inhibited memory cells in the page.

FIG. 12 illustrates a programming circuit that optimizes the timing of individual programming pulses according to the relative number of program-enabled and program-inhibited memory cells in the page. A programming circuit 230 includes a number of word line drivers 232 applies specified word line voltages $V_{WL}$s to a selection of word lines 42. The selection is effected by a word line decoder (not shown). The word line driver 232 applies a specified $V_{WL}$ to the word line 42 via the access node 46. As the programming loop proceeds, each pulse can be identified by its pulse number (see FIG. 9). For a given pulse at its pulse number, a control circuitry 230, responsive to the relative number of programmed-enabled and program-inhibited memory cells at the pulse number, controls the word line driver 232 to output a word line voltage with an optimized timing for the current pulse.

The following equations will describe the variation of the effective RC of the word line with the relative numbers of program-enabled and program-inhibited memory cells in a page.

$$\text{Number of NAND stings in a page} = \text{Number of memory cells in a page} = N \qquad \text{Eqn (1)}$$

$$\text{Number of program-enabled memory cells in a page} = n_1 \qquad \text{Eqn (2)}$$

$$\text{Number of program-inhibited memory cells in a page} = n_2 \qquad \text{Eqn (3)}$$

Eqn (1)-Eqn (3) give:

$$N = n_1 + n_2 \qquad \text{Eqn (4)}$$

Effective word line $RC_{\mathit{eff}} = R(Cw + n_1 Cs)$      Eqn (5)

Where Cw is the capacitance due to the word line and Cs is the capacitance due to a NAND string.

The largest RCmax is when all memory cells of the page are program-enabled:

$RCmax = R(Cw + NCs)$      Eqn (6)

The smallest RCmin is when all memory cells of the page are program-inhibited:

$RCmin = RCw$      Eqn (7)

Expressing Eqn(5) in terms of RCmax and RCmin using Eqn(5)-Eqn(7):

Effective word line $RC_{\mathit{eff}} = (n_2/N) RCmin + (n_1/N) RCmax$      Eqn (8)

Figure 13:
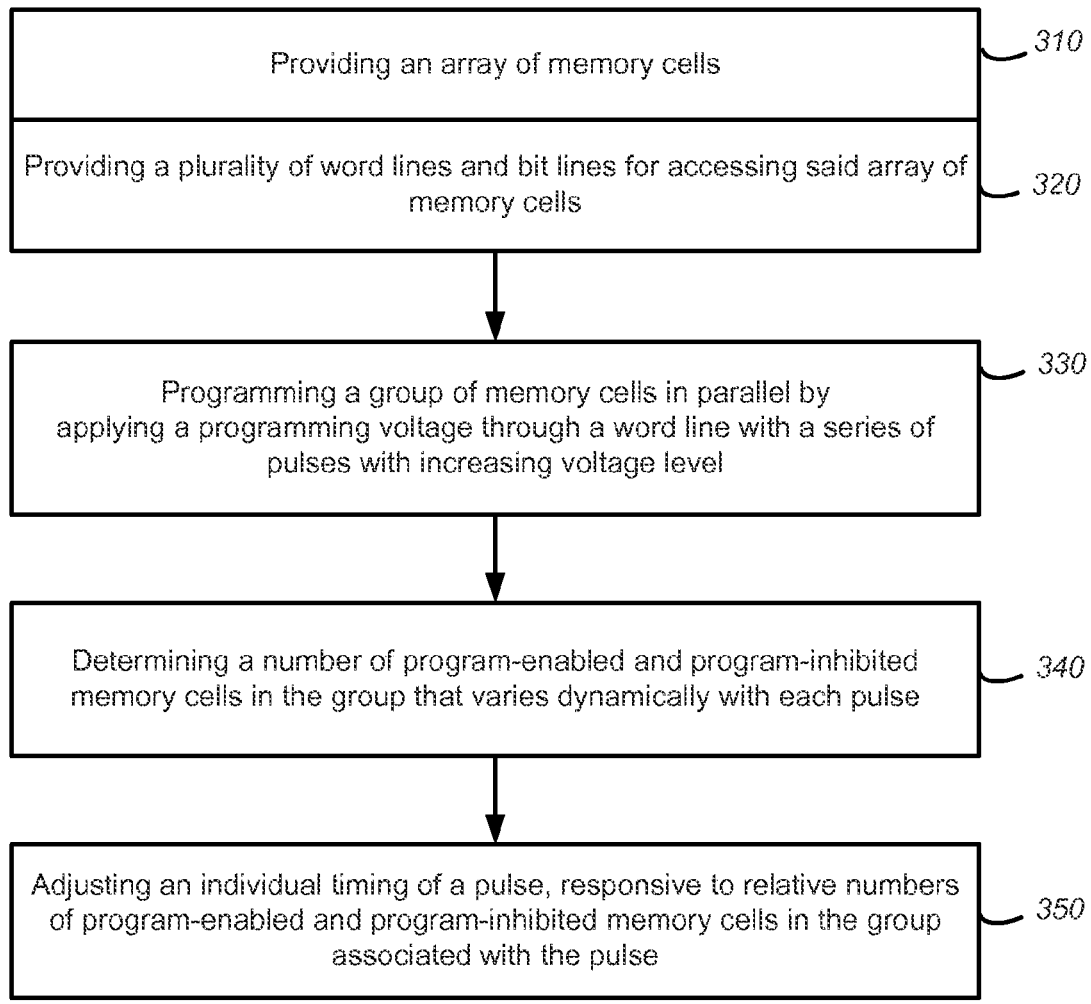
FIG. 13 is a flow chart illustrating a method of programming with adaptive timing of individual programming pulses.

FIG. 13 is a flow chart illustrating a method of programming with adaptive timing of individual programming pulses.

STEP 310: Providing an array of memory cells.

STEP 320: Providing a plurality of word lines and bit lines for accessing said array of memory cells.

STEP 330: Programming a group of memory cells in parallel by applying a programming voltage through a word line with a series of pulses with increasing voltage level.

STEP 340: Determining a number of program-enabled and program-inhibited memory cells in the group that varies dynamically with each pulse.

STEP 350: Adjusting an individual timing of a pulse, responsive to relative numbers of program-enabled and program-inhibited memory cells in the group associated with the pulse.

When the timing of the pulses is individually optimized, the overall programming time is reduced. For example, the time delays of pulses later in the series are set to less those earlier in the series, as more and more program-enabled memory cells become program-inhibited memory cells during the course of the programming. The reduced programming time also helps to reduce program disturb. This is owing to minimizing the time for the program-inhibited memory cells to hold the boosted voltage during programming, which has a tendency to leaking away, thereby reducing their program-inhibition efficacy and causing unwanted programming.

While the description of the examples above is on the timing of the programming voltage on a selected word line, the same principle of individually optimized timing applies to the timing for charging up unselected word lines. For example in a memory with NAND architecture, the unselected word lines of a NAND string are precharged to a predetermined voltage (Vpass) to turn on the unselected memory cells in the NAND string. The timing for precharge can also be optimized according to the relative numbers of program-enabled and program-inhibited memory cells in the group associated with the pulse at the time.

An Example of 3D Nonvolatile Memories

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 14-FIG. 17 illustrate a particular monolithic three dimensional (3D) memory array of the NAND type (more specifically of the "BiCS" type), where one or more memory device levels are formed above a single substrate, in more detail.

Figure 14:
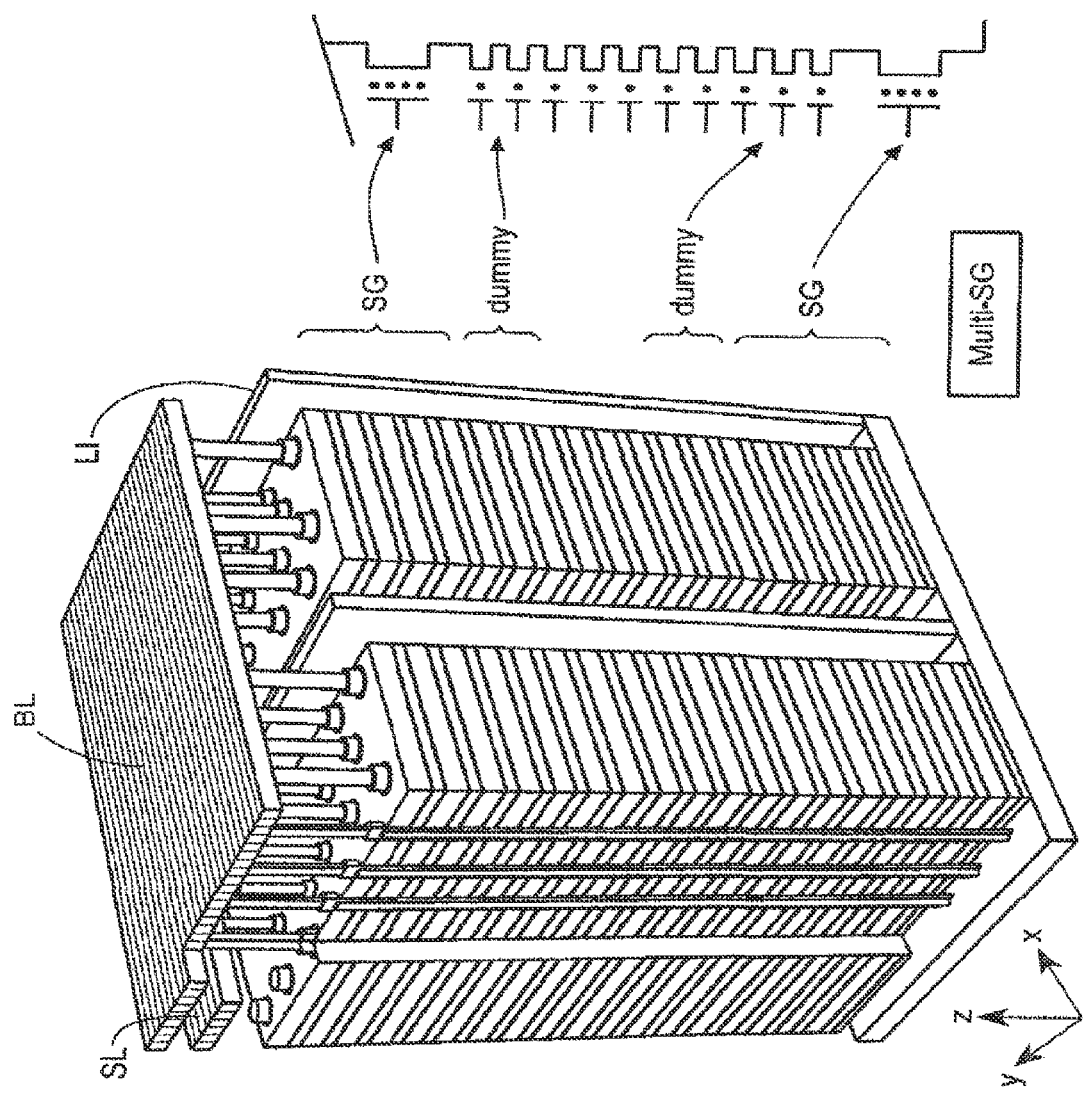
FIG. 14 is an oblique projection of part of a 3D NAND memory.

FIG. 14 is an oblique projection of part of a 3D NAND memory. FIG. 14 illustrate a portion corresponding to two of the page structures in FIG. 6, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 14 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 15:
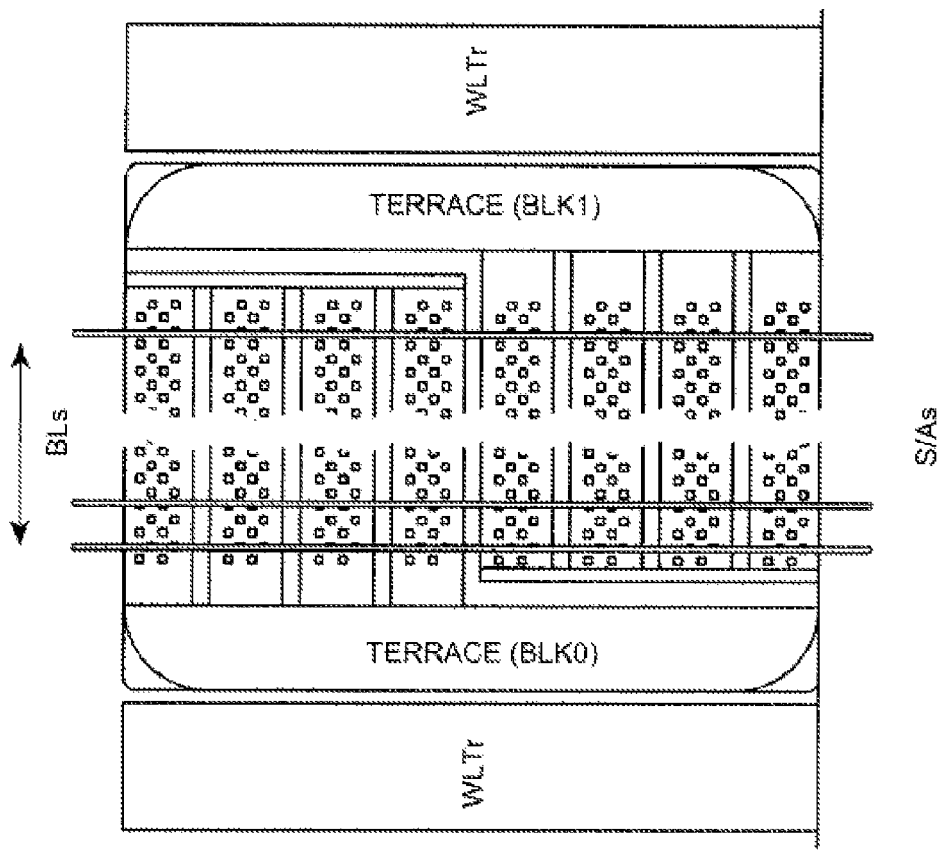
FIG. 15 shows a top view of the structure for two blocks in the exemplary embodiment.

FIG. 15 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 16:
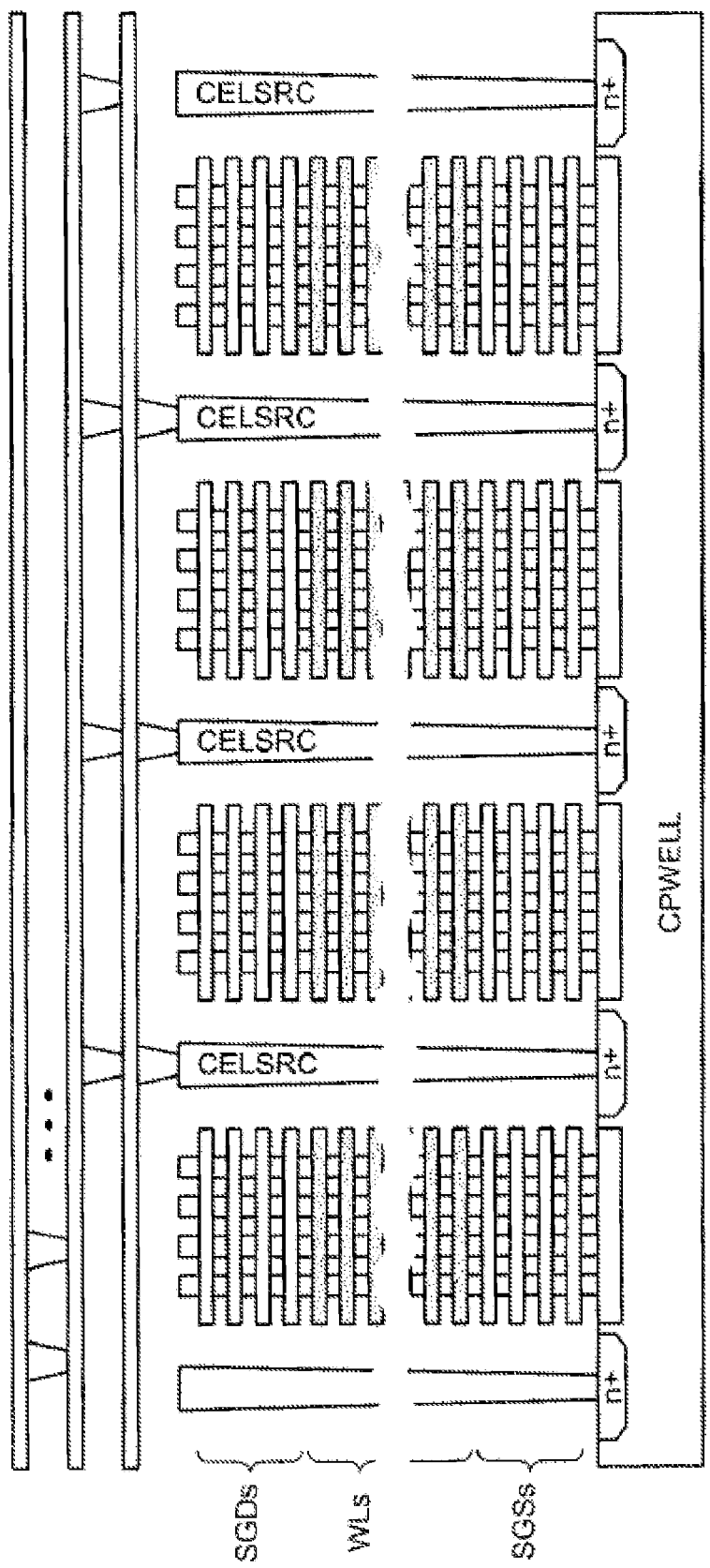
FIG. 16 shows a side view of one block, again with four fingers.

FIG. 16 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 17:
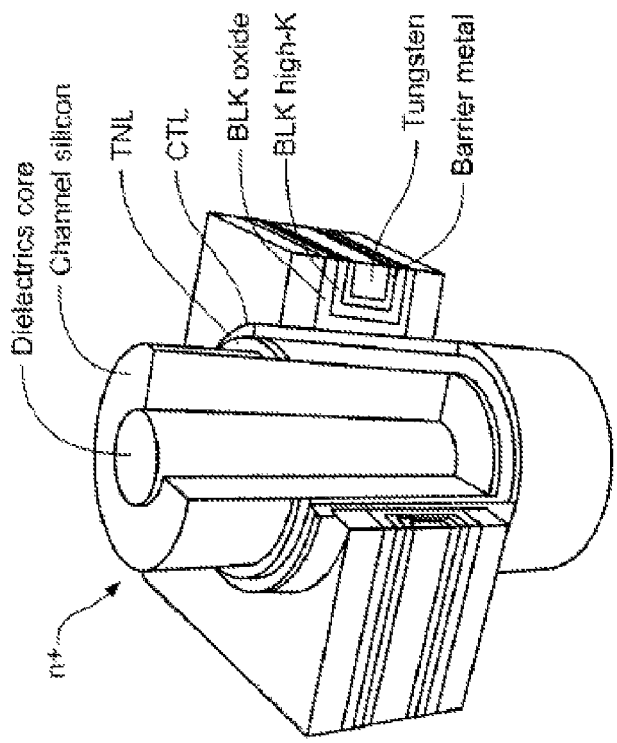
FIG. 17 illustrates some detail of an individual cell.

FIG. 17 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

The foregoing detailed description has been presented for purposes of illustration and description. It is not intended to be exhaustive or to limit the above to the precise form disclosed. Many modifications and variations are possible in light of the above teaching. The described examples were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A non-volatile memory, comprising:
an array of memory cells;
a plurality of word lines and bit lines for accessing the array of memory cells; and
a programming circuit for programming a group of memory cells in parallel,
the programming circuit comprising:
word line driver circuitry for providing a programming voltage to a selected word line to the group of memory cells, the programming voltage comprising a series of pulses having increasing voltage levels;
the group of memory cells having a number of program-enabled and program-inhibited memory cells that varies dynamically with each pulse of the series of pulses; and
the word line driver circuitry including a control module to adjust an individual timing of a pulse of the series of pulses, responsive to relative numbers of program-enabled and program-inhibited memory cells in the group of memory cells associated with the pulse.

2. The non-volatile memory as in claim 1, wherein the individual timing comprises a rise time and a fall time of the pulse.

3. The non-volatile memory as in claim 1, wherein:
each memory cell of the array of memory cells has a channel with a word-line-to-channel capacitance between the channel and a respective word line; and
the individual timing depends on a sum of the word-line-to-channel capacitance of the group of memory cells under programming.

4. The non-volatile memory as in claim 3, wherein the word-line-to-channel capacitance is a function of the relative numbers of the program-enabled and program-inhibited memory cells in the group of memory cells.

5. The non-volatile memory as in claim 3, wherein the individual timing depends on an RC constant of the selected word line, wherein R and C are respectively a resistance and an effective capacitance of the word line, the effective capacitance of the selected word line comprising the word-line-to-channel capacitance.

6. The non-volatile memory as in claim 5, wherein:
the RC constant has a maximum value of RCmax when all memory cells of the group of memory cells are program-enabled and has a minimum value of RCmin when all memory cells of the group of memory cells are program-inhibited; and
the RC constant is given by $(n_2/N)RCmin+(n_1/N)RCmax$, where N is the total number of memory cells in the group of memory cells, and $n_1$ and $n_2$ are respectively the number of program-enabled and program-inhibited memory cells just prior to the pulse.

7. The non-volatile memory as in claim 1, wherein each memory cell of the array of memory cells comprises a charge-storage element.

8. The non-volatile memory as in claim 1, wherein:
each pulse in the series of pulses is identified by a pulse number; and
the number of program-enabled and program-inhibited memory cells associated with the pulse is a function of the pulse number associated with the pulse.

9. The non-volatile memory as in claim 1, wherein the array of memory cells is organized in a 3D pattern.

10. The non-volatile memory as in claim 1, wherein the word line driver circuitry further comprises a second control module to adjust a timing of precharging unselected word lines, responsive to relative numbers of program-enabled and program-inhibited memory cells in the group of memory cells associated with the pulse.

11. A method of operating a non-volatile memory, comprising:
providing an array of memory cells;
providing a plurality of word lines and bit lines for accessing the array of memory cells; and
programming a group of memory cells in parallel,
the programming comprising:
applying a programming voltage to a selected word line to the group of memory cells, the programming voltage comprising a series of pulses having increasing voltage levels;
determining a number of program-enabled and program-inhibited memory cells in the group of memory cells that varies dynamically with each pulse of the series of pulses; and
adjusting an individual timing of a pulse of the series of pulses, responsive to relative numbers of program-enabled and program-inhibited memory cells in the group of memory cells associated with the pulse.

12. The method of operating the non-volatile memory as in claim 11, wherein
the individual timing comprises a rise time and a fall time of the pulse.

13. The method of operating the non-volatile memory as in claim 11, wherein:
each memory cell of the array of memory cells has a channel with a word-line-to-channel capacitance between the channel and a respective word line; and
the individual timing depends on a sum of the word-line-to-channel capacitance of the group of memory cells under programming.

14. The method of operating the non-volatile memory as in claim 13, wherein
the word-line-to-channel capacitance is a function of the relative numbers of the program-enabled and program-inhibited memory cells in the group of memory cells.

15. The method of operating the non-volatile memory as in claim 13, wherein
the individual timing depends on an RC constant of the selected word line, wherein R and C are respectively a resistance and an effective capacitance of the word line, the effective capacitance of the word line comprising the word-line-to-channel capacitance.

16. The method of operating the non-volatile memory as in claim 15, wherein:

the RC constant has a maximum value of RCmax when all memory cells of the group of memory cells are program-enabled, and has a minimum value of RCmin when all memory cells of the group of memory cells are program-inhibited; and the RC constant is given by $(n_2/N)RCmin+(n_1/N)RCmax$, where N is the total number of memory cells in the group of memory cells, and $n_1$ and $n_2$ are respectively the number of program-enabled and program-inhibited memory cells just prior to the pulse.

17. The method of operating the non-volatile memory as in claim 11, wherein
each memory cell of the array of memory cells comprises a charge-storage element.

18. The method of operating the non-volatile memory as in claim 11, wherein:
each pulse in the series of pulses is identified by a pulse number; and
the number of program-enabled and program-inhibited memory cells associated with the pulse is a function of the pulse number associated with the pulse.

19. The method of operating the non-volatile memory as in claim 11, further comprising:
adjusting a timing of precharging unselected word lines, responsive to relative numbers of program-enabled and program-inhibited memory cells in the group of memory cells associated with the pulse.

20. A non-volatile memory comprising:
a 3D array of memory cells organized as a 2D array of vertical NAND strings across multiple memory planes above a substrate, with each memory cell of a NAND string residing in a different memory plane;
a plurality of word lines and bit lines for accessing the array of memory cells; and
a programming circuit for programming a group of memory cells in parallel,
the programming circuit comprising:
word line driver circuitry for providing a programming voltage to a selected word line to the group of memory cells, the programming voltage comprising a series of pulses having increasing voltage levels;
the group of memory cells, having a number of program-enabled and a number of program-inhibited memory cells, that varies dynamically with each pulse of the series of pulses; and
the word line driver circuitry comprising a control module to adjust an individual timing of a pulse of the series of pulses, responsive to relative numbers of program-enabled and program-inhibited memory cells in the group of memory cells associated with the pulse.

* * * * *

UNITED STATES PATENT AND TRADEMARK OFFICE
CERTIFICATE OF CORRECTION

| | | |
|---|---|---|
| PATENT NO. | : 9,318,204 B2 | Page 1 of 1 |
| APPLICATION NO. | : 14/508352 | |
| DATED | : April 19, 2016 | |
| INVENTOR(S) | : Chen et al. | |

It is certified that error appears in the above-identified patent and that said Letters Patent is hereby corrected as shown below:

Title Page, in item (10), please replace "B1" with -- B2 --.

Title Page, please insert item (65):

-- Prior Publication Data    US 2016/0099059 A1   Apr. 7, 2016 --.

Signed and Sealed this
Nineteenth Day of July, 2016

Michelle K. Lee
*Director of the United States Patent and Trademark Office*